(12) United States Patent
Lai et al.

(10) Patent No.: US 10,154,578 B2
(45) Date of Patent: Dec. 11, 2018

(54) HEAT DISSIPATER RESILIENT STRUCTURE AND CONNECTOR MODULE

(71) Applicant: GIGA-BYTE TECHNOLOGY CO., LTD., New Taipei (TW)

(72) Inventors: Chih-Ming Lai, New Taipei (TW); Yung-Shun Kao, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/616,930

(22) Filed: Jun. 8, 2017

(65) Prior Publication Data

US 2018/0295710 A1 Oct. 11, 2018

(30) Foreign Application Priority Data

Apr. 11, 2017 (TW) .............................. 106111972 A

(51) Int. Cl.
*F28F 7/00* (2006.01)
*H05K 1/02* (2006.01)
*H05K 7/20* (2006.01)

(52) U.S. Cl.
CPC ....... *H05K 1/0203* (2013.01); *H05K 7/20472* (2013.01)

(58) Field of Classification Search
CPC .............. H01K 1/0203; H01K 7/20472; H01L 23/4093; H01L 23/4006

USPC ........................................................ 165/80.3
See application file for complete search history.

(56) References Cited

U.S. PATENT DOCUMENTS

| | | | | |
|---|---|---|---|---|
| 6,473,306 B2* | 10/2002 | Koseki | ................ | H01L 23/4093 165/185 |
| 6,574,109 B1* | 6/2003 | McHugh | ............. | H01L 23/4093 165/80.3 |
| 6,672,374 B1* | 1/2004 | Lin | ...................... | H01L 23/4093 165/121 |
| 6,968,889 B2* | 11/2005 | Wang | .................. | H01L 23/4006 165/185 |
| 7,102,890 B2* | 9/2006 | Lee | ...................... | H01L 23/4093 165/185 |

* cited by examiner

*Primary Examiner* — Davis Hwu
(74) *Attorney, Agent, or Firm* — JCIPRNET

(57) ABSTRACT

A heat dissipater resilient structure is adapted to be fixed to a connector of a motherboard and for an expansion card heat dissipater to be disposed on. The heat dissipater resilient structure includes a body, an arm and a fixing member. The body is adapted to be fixed to the connector. The arm extends from the body and is bendable between a first position and a second position. The fixing member is located at the body or the arm. The expansion card heat dissipater is adapted to be fixed to the fixing member and lean against the arm to move with the arm. When pressed, the expansion card heat dissipater is adapted to move with the arm from the first position to the second position. When not pressed, the arm moves with the expansion card heat dissipater to return to the first position. A connector module is further provided.

10 Claims, 8 Drawing Sheets

HEAT DISSIPATER RESILIENT STRUCTURE AND CONNECTOR MODULE

CROSS-REFERENCE TO RELATED APPLICATION

This application claims the priority benefit of Taiwan application serial no. 106111972, filed on Apr. 11, 2017. The entirety of the above-mentioned patent application is hereby incorporated by reference herein and made a part of this specification.

BACKGROUND OF THE INVENTION

1. Field of the Invention

The invention relates to a resilient structure and a module having the resilient structure, and particularly relates to a heat dissipater resilient structure and a connector module having the heat dissipater resilient structure.

2. Description of Related Art

As the user's demands increase, more and more connectors are disposed on a motherboard to offer more functions. For example, a next generation form factor (NGFF) slot, i.e., an M.2 slot, may be disposed on the motherboard for insertion of an expansion card having an M.2 interface (e.g., a solid state drive having an M.2 interface). A high-performance expansion card of this kind transmits data at a high speed. Thus, a significant amount of heat may be generated during operation, and the temperature is thus increased. In order to prevent the performance of the expansion card from being affected due to overheating, a heat dissipater for the expansion card may be disposed to quickly discharge the heat.

Generally speaking, the heat dissipater is fixed to the expansion card or the motherboard through fastening with a plurality of screws, for example. If the expansion card heat dissipater is to be removed or the expansion card is to be replaced, the screws of the expansion card heat dissipater must be removed, and then the expansion card heat dissipater can be obtained. However, due to a limited space on the motherboard, there may be other closely disposed electronic components or slots near the expansion card heat dissipater. Thus, it is not easy for the user to obtain the expansion card heat dissipater.

SUMMARY OF THE INVENTION

The invention provides a heat dissipater resilient structure enabling an expansion card heat dissipater to pop up automatically. Accordingly, the user may conveniently obtain the expansion card heat dissipater or replace the expansion card below the expansion card heat dissipater.

The invention provides a connector module including the heat dissipater resilient structure.

A heat dissipater resilient structure according to an embodiment of the invention is adapted to be fixed to a connector on a motherboard and for an expansion card heat dissipater to be disposed on. The heat dissipater resilient structure includes a body, an arm, and a fixing member. The body is adapted to be fixed to the connector. The arm extends from the body and is bendable between a first position and a second position. The fixing member is located at the body or the arm. In addition, the expansion card heat dissipater is adapted to be fixed to the fixing member of the heat dissipater resilient structure and leans against the arm to move with the arm. The expansion card heat dissipater is adapted to move with the arm from the first position to the second position when pressed, and the arm moves with the expansion card heat dissipater to return to the first position when the expansion card heat dissipater is released from pressing.

According to an embodiment of the invention, a portion of the arm away from the body forms an inclined surface, and the inclined surface extends upwardly.

According to an embodiment of the invention, the fixing member is a perforated slot located at the arm or the body for the expansion card heat dissipater to pass through.

According to an embodiment of the invention, the body includes a solder leg adapted to be fixed to the motherboard.

A connector module according to an embodiment of the invention is adapted to be fixed to a motherboard and connected with an expansion card. The connector module includes a connector, a heat dissipater resilient structure, and an expansion card heat dissipater. The heat dissipater resilient structure includes a body, an arm and a fixing member. The body is fixed to the connector. The arm extends from the body and is bendable relative to the body. The fixing member is located at the body or the arm. The expansion card heat dissipater is detachably fixed to the fixing member of the heat dissipater resilient structure and leans against the arm to move with the arm between a first position and a second position. An acute angle is included between the expansion card heat dissipater and the expansion card when the expansion card is inserted into the connector and the expansion card heat dissipater is located at the first position. The expansion card heat dissipater abuts against the expansion card when the expansion card heat dissipater is pressed and moves with the arm to the second position. The arm moves with the expansion card heat dissipater to return to the first position when the expansion card heat dissipater is released from pressing.

According to an embodiment of the invention, a portion of the arm away from the body gradually extends away from the motherboard to form an inclined surface, and the inclined surface extends upwardly.

According to an embodiment of the invention, the fixing member is a perforated slot located at the arm or the body for the expansion card heat dissipater to pass through.

According to an embodiment of the invention, the body includes a solder leg adapted to be fixed to the motherboard.

According to an embodiment of the invention the expansion card heat dissipater includes a base and a fin set disposed on the base, the base includes two holding members located at opposite sides, and the two holding members respectively extend from the base in directions away from the fin set and are adapted to hold the expansion card.

According to an embodiment of the invention, the base further includes a base fixing member adapted to be fixed to the motherboard.

According to an embodiment of the invention, the connector includes a first engagement part, the body of the heat dissipater resilient structure includes a second engagement part corresponding to the first engagement part, and the body of the heat dissipater resilient structure is fixed to the connector by fitting of the first engagement part and the second engagement part.

Based on the above, the heat dissipater resilient structure according to the embodiments may be fixed to the connector. When the expansion card heat dissipater is to be disposed, the expansion card heat dissipater may be fixed to the fixing member of the heat dissipater resilient structure. Under such circumstance, the expansion card heat dissipater leans against the arm. Then, as long as a force is exerted to the end of the expansion card heat dissipater away from the heat dissipater resilient structure, the expansion card heat dissipater may move with the arm from the first position to the second position to abut against the expansion card. Then, the end of the expansion card heat dissipater away from the heat dissipater resilient structure may be fixed to the motherboard by locking, for example. When the expansion card heat dissipater is to be removed or the expansion card is to be replaced, by canceling fixing between the expansion card heat dissipater and the motherboard, the anti of the heat dissipater resilient structure may drive the expansion card heat dissipater upward to return to the first position. Accordingly, the user may conveniently obtain the expansion card heat dissipater or replace the expansion card located below the expansion card heat dissipater.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
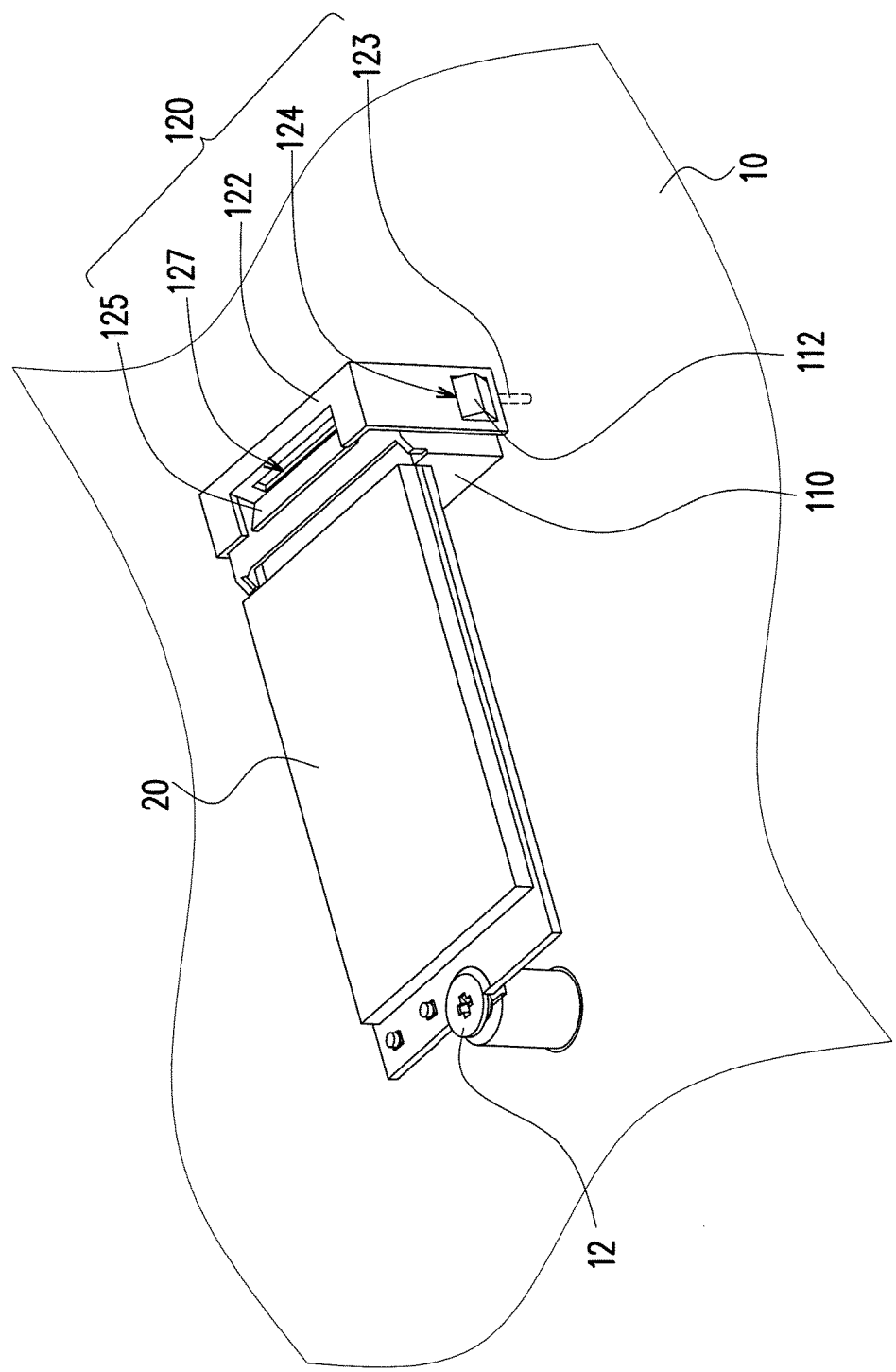
FIG. 1 is a schematic view illustrating a connector and a heat dissipater resilient structure of a connector module according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
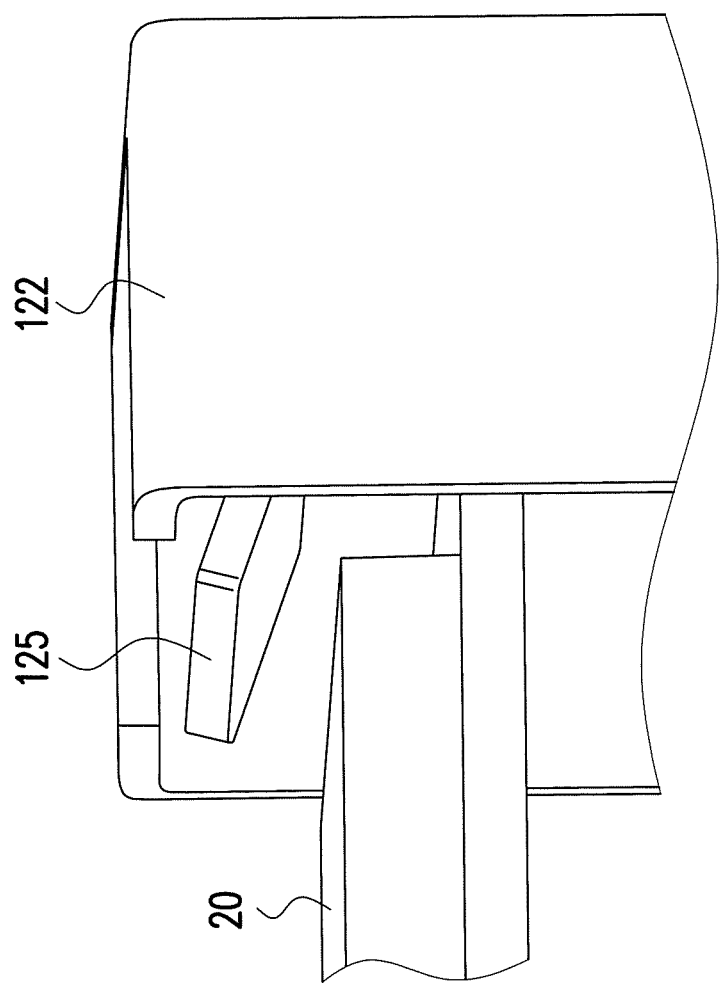
FIG. 2 is a schematic view illustrating the heat dissipater resilient structure of FIG. 1 from another perspective.

FIG. 1 is a schematic view illustrating a connector and an heat dissipater resilient structure of a connector module according to an embodiment of the invention. FIG. 2 is a schematic view illustrating the heat dissipater resilient structure of FIG. 1 from another perspective. Referring to FIGS. 1 and 2, a connector module 100 (marked in FIG. 4) of the embodiment is fixed to a motherboard 10 and is adapted to be connected with an expansion card 20. In the embodiment, the connector module 100 includes a connector 110, a heat dissipater resilient structure 120, and an expansion card heat dissipater 130 (shown in FIG. 3). As an example, the connector 110 is a connector 110 having an M.2 interface, and the expansion card 20 is an expansion card 20 having an M.2 interface, such as a solid state drive having an M.2 interface. It should be noted that the types of the connector 110 and the expansion card 20 are not limited thereto. Other types of the connector 110 whose socket is parallel to the motherboard 10 and the corresponding expansion card 20 are also applicable.

As shown in FIG. 1, the heat dissipater resilient structure 120 includes a body 122, an arm 125, and a fixing member 127. The body 122 is fixed to the connector 110. In the embodiment, the connector 110 includes two first engagement parts 112 located at opposite sides. In FIG. 1, only one of the first engagement parts 112 is shown due to the viewing perspective, and the other first engagement part 112 is located at the opposite side. The body 122 of the heat dissipater resilient structure 120 includes two second engagement parts 124 located at opposite sides and corresponding to the first engagement parts 112. More specifically, the first engagement part 112 is a snap, for example, and the second engagement part 124 is a slot, for example. The body 122 of the heat dissipater resilient structure 120 is connected to the connector 110 through fitting of the first engagement part 112 and the second engagement part 124. It should be noted that, in other embodiments, the quantities, positions, and types of the first engagement part 112 and the second engagement part 124 are not limited thereto, as long as the body 122 of the heat dissipater resilient structure 120 is fixed to the connector 110.

Besides, in the embodiment, the body 122 of the heat dissipater resilient structure 120 includes at least one solder leg 123, and the solder leg 123 may be fixed to the motherboard 10 by reflowing, for example. In other words, in the embodiment, the body 122 of the heat dissipater resilient structure 120 is further fixed to the motherboard 10 in addition to being fixed to the connector 10, so as to render desirable stability by dual fixing arrangements. It should be noted that, in other embodiments, the body 122 of the heat dissipater resilient structure 120 may omit the solder leg 123 or omit the first engagement parts 112 and the second engagement parts 124, and the body 122 may be fixed to one of the connector 110 or the motherboard 10. Moreover, in the embodiment, the solder leg 123 may also be connected to a ground line of the motherboard 10. However, in other embodiments, the solder leg 123 may not be connected to the ground line of the main board 10 and is disposed only for fixing.

Furthermore, in the embodiment, a material of the body 122 of the heat dissipater resilient structure 120 may include metal. Since the body 122 covers the connector 110, the body 122 may offer electromagnetic shielding for the connector 110 and may facilitate structural strength of the connector 110.

Referring to FIG. 1 again, the arm 125 of the heat dissipater resilient structure 120 extends from a top surface of the body 122. In the embodiment, a material of the heat dissipater resilient structure 120 may include metal. Therefore, the protruding arm 125 is bendable relative to the body 122. In the embodiment, a side surface of the arm 125 is roughly in a V shape. A half part of the arm 125 near the body 122 from which the arm 125 extends is in a direction gradually toward the motherboard 10 and forms a downwardly inclined surface. A half part of the arm 125 away from the body 122 forms an upwardly inclined surface (as shown in FIG. 2) in a direction gradually away from the motherboard 10.

The fixing member 127 of the heat dissipater resilient structure 120 is located at the body 122 or the arm 125. In the embodiment, the fixing member 127 of the heat dissipater resilient structure 120 is a perforated slot located at the arm 125. More specifically, the fixing member 127 is located at the half of the arm 125 near the body 122 from which the arm 125 extends for the expansion card heat dissipater 130 (marked in FIG. 3) to pass through.

Figure 3:
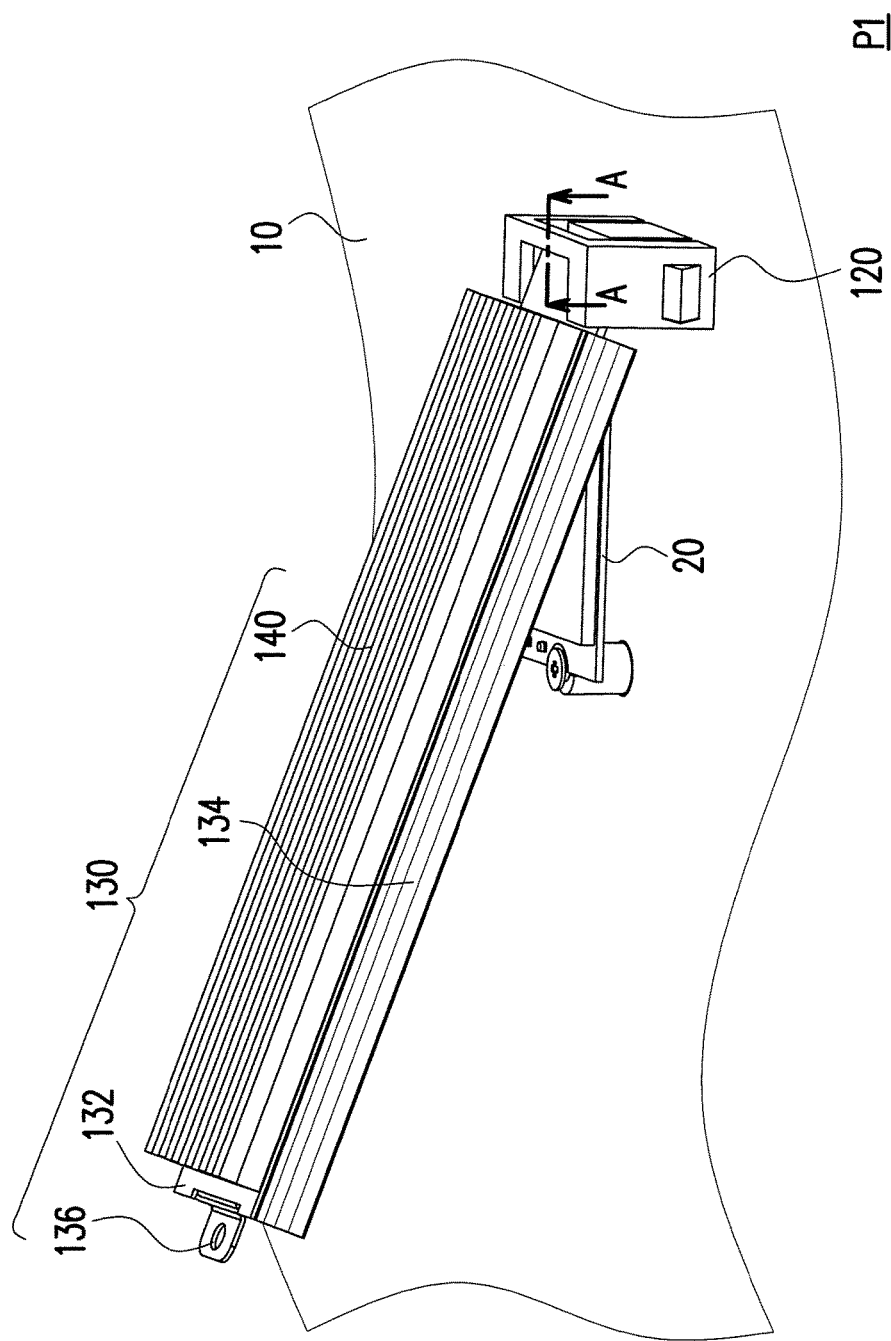
FIG. 3 is a schematic view illustrating that an expansion card heat dissipater of a connector module is disposed at a heat dissipater resilient structure and is located at a first position.
Figure 4:
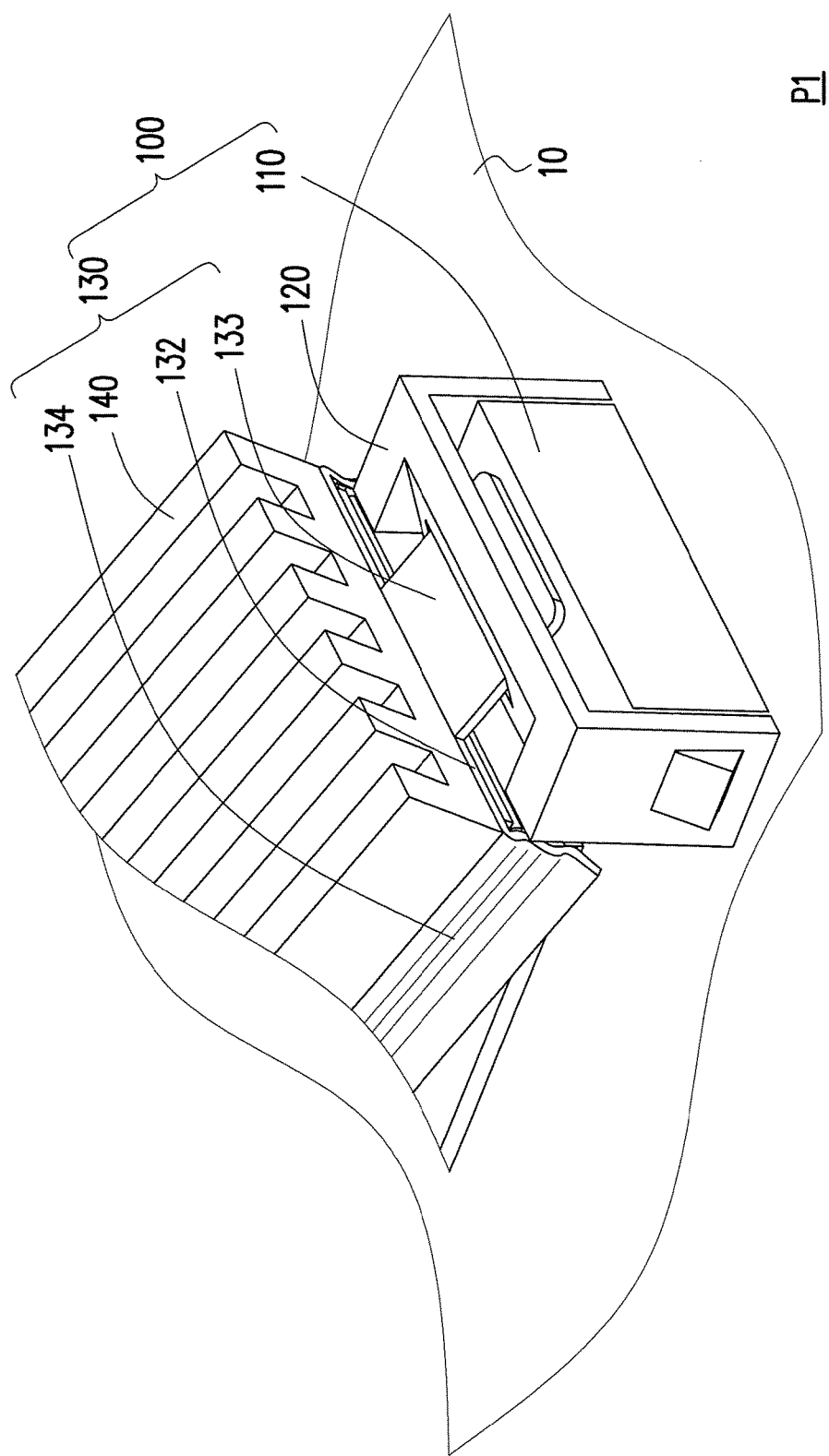
FIG. 4 is partial schematic enlarged view of FIG. 3 from another perspective.

FIG. 3 is a schematic view illustrating that the expansion card heat dissipater 130 of the connector module 100 is disposed at the heat dissipater resilient structure 120 and is located at a first position P1. FIG. 4 is partial schematic enlarged view of FIG. 3 from another perspective. Referring to FIGS. 3 and 4, in the embodiment, the expansion card heat dissipater 130 includes a base 132, a tongue 133 extending from the base 132, and a fin set 140 disposed on the base 132. The expansion card heat dissipater 130 is adapted to dissipate heat for the expansion card 20 connected to the connector 110. As shown in FIG. 4, the expansion card heat dissipater 130 is detachable fixed to the fixing member 127 of the heat dissipater resilient structure 120. More specifically, the tongue 133 at a front end of the base 132 of the expansion card heat dissipater 130 may be inserted into the fixing member 127 (perforated slot) of the resilient structure 120 of the heat dissipater. After the front end of the base 132 of the expansion card heat dissipater 130 is inserted into the fixing member 127, the base 132 of the expansion card heat dissipater 130 may lean against the arm 125 of the heat dissipater resilient structure 120 to move with the arm 125. Accordingly, the expansion card heat dissipater 130 may move with the arm 125 between the first position P1 (a lifting position shown in FIGS. 3, 4, and 6) and a second position P2 (a horizontal position shown in FIGS. 5 and 7). As shown in FIG. 3, when the expansion card 20 is inserted into the connector 110 and the expansion card heat dissipater 130 is located at the first position P1, an acute angle is included between the expansion card heat dissipater 130 and the expansion card 20. In other words, an end of the expansion card heat dissipater 130 away from the heat dissipater resilient structure 120 rises up.

Figure 5:
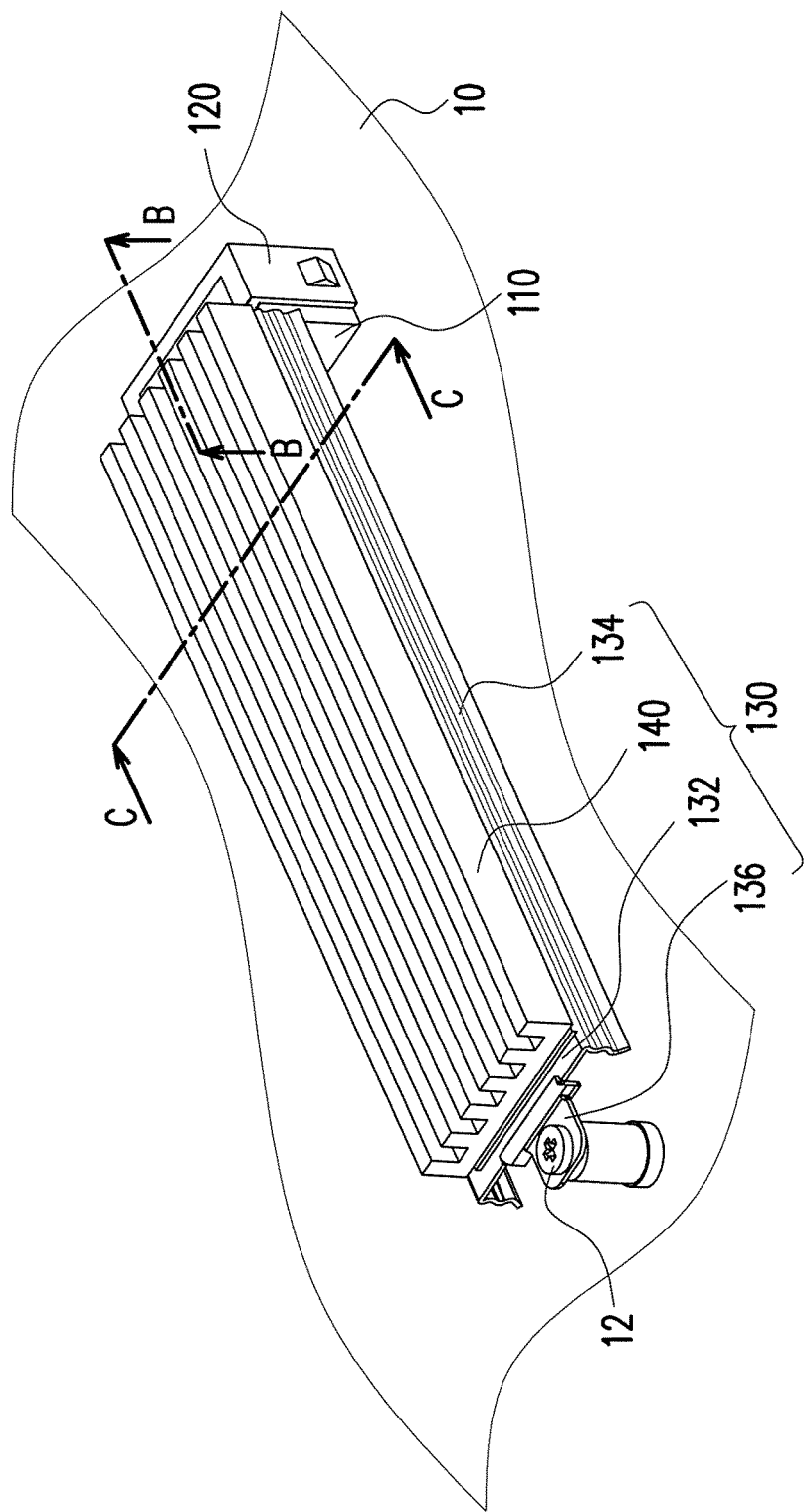
FIG. 5 is a schematic view illustrating that an expansion card heat dissipater of a connector module is located at a second position and fixed to a motherboard.
Figure 6:
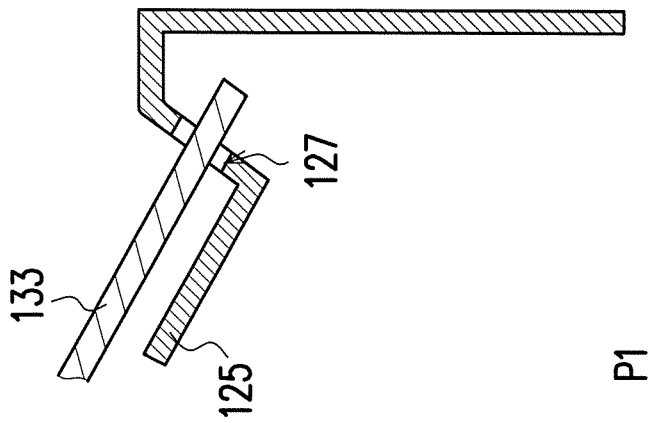
FIG. 6 is a schematic cross-sectional view along a line A-A of FIG. 3.
Figure 7:
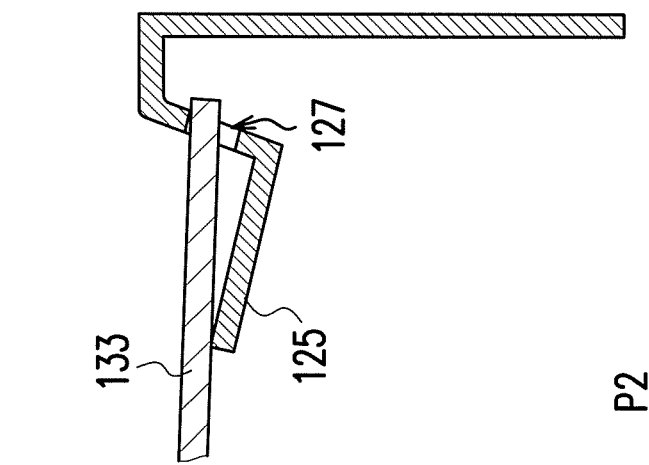
FIG. 7 is a schematic cross-sectional view along a line B-B of FIG. 5.

FIG. 5 is a schematic view illustrating that the expansion card heat dissipater 130 of the connector module 100 is located at the second position P2 and fixed to the motherboard 10. FIG. 6 is a schematic cross-sectional view along a line A-A of FIG. 3. FIG. 7 is a schematic cross-sectional view along a line B-B of FIG. 5. Referring to FIGS. 5 and 7, in the embodiment, when the front end of the base 132 of the expansion card heat dissipater 130 is inserted into the fixing member 127 of the heat dissipater resilient structure 120, as long as the end of the expansion card heat dissipater 130 away from the heat dissipater resilient structure 120 (the end at the left side of FIG. 3) is pressed, the expansion card heat dissipater 130 may move with the arm 125 from the first position P1 shown in FIG. 6 to the second position P2 shown in FIG. 7 to abut against the expansion card 20 (shown in FIG. 3).

Then, as shown in FIG. 5, the expansion card heat dissipater 130 may be fixed to the expansion card 20 or the motherboard 10. In the embodiment, the base 132 includes a base fixing member 136 located at a rear end. The base fixing member 136 may be a through hole for a screw 12 to pass through, so as to fix the base 132 to the motherboard 10. The base fixing member 136 may also be a lock, a latch, or a similar structure, and shall not be limited by the illustration of the drawings.

Figure 8:
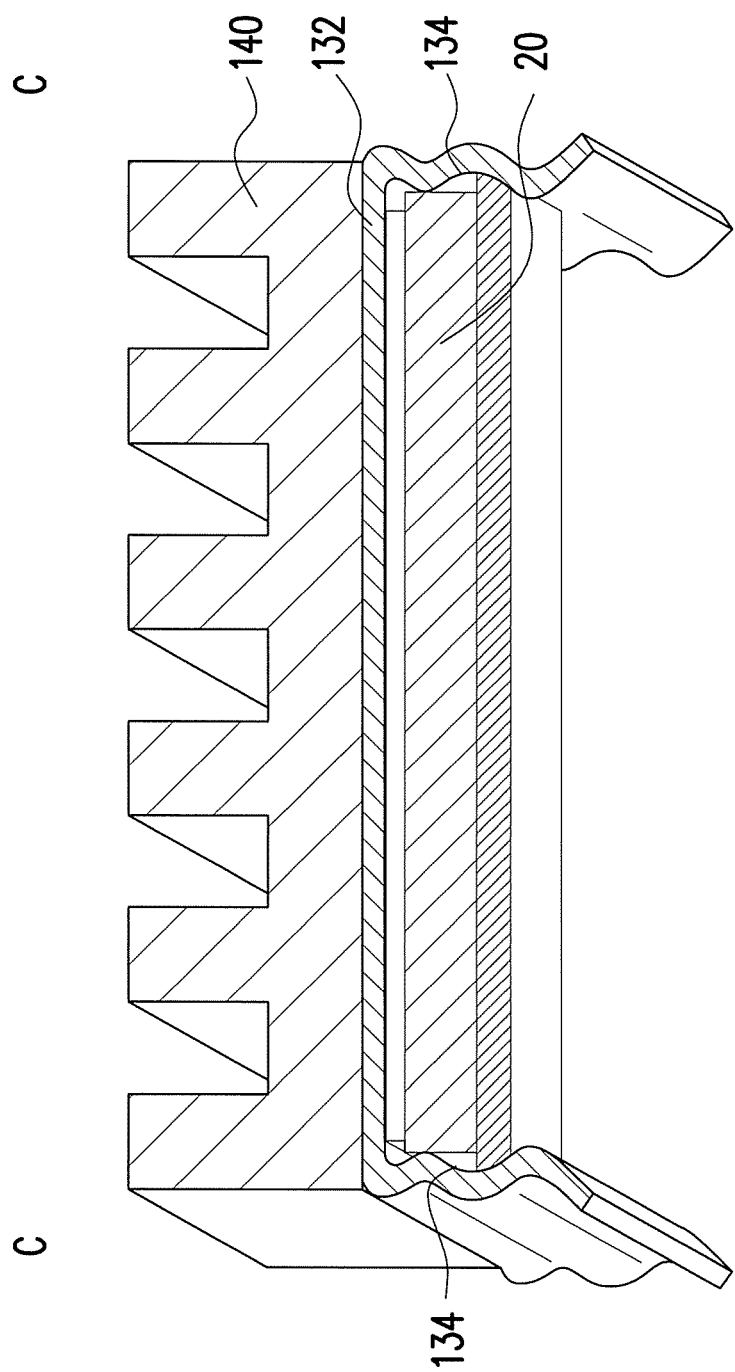
FIG. 8 is a schematic cross-sectional view along a line C-C of FIG. 5.

FIG. 8 is a schematic cross-sectional view along a line C-C of FIG. 5. Referring to FIG. 8, in the embodiment, the base 132 further includes two holding parts 134 located at opposite sides. The two holding parts 134 respectively extend from the base 132 in a direction away from the fin set 140 to hold the expansion card 20. In other words, in the embodiment, when the expansion card heat dissipater 130 moves to the second position P2, the base 132 of the expansion card heat dissipater 130 is fixed to the expansion card 20 through the two holding parts 134, and is fixed to the motherboard 10 through the base fixing member 136. It should be noted that, in other embodiments, the base 132 may also be only fixed to the expansion card 20 through the two holding parts 134 or only fixed to the motherboard 10 through the base fixing member 136.

Afterwards, when the expansion card heat dissipater 130 is to be removed or the expansion card 20 is to be replaced, it only requires to cancel fixing between the expansion card heat dissipater 130 and the motherboard 10 and between the expansion card heat dissipater 130 and the expansion card 20. For example, by removing locking between the base 132 and the motherboard 10 and then slightly exerting a force to lift the base 132 upward and detach the holding parts 134 from the expansion card 20, the arm 125 of the heat dissipater resilient structure 120 may drive the expansion card heat dissipater 130 upward to return to the first position P1.

When the arm 125 is not pressed, the half away from the body 122 is the upwardly inclined surface. Therefore, when the expansion card heat dissipater 130 is at the first position P1, the end away from the heat dissipater resilient structure 120 may also rise up. The uprising part of the expansion card heat dissipater 130 may be higher than electronic components or sockets nearby, so that the user may conveniently hold the heat dissipater 130 for the expansion card. In addition, since the expansion card heat dissipater 130 is fixed to the body 122 of the heat dissipater resilient structure 120 by passing through the body 122, the user may conveniently draw out the expansion card heat dissipater 130 directly to obtain the heat dissipater 130. However, in other embodiments, the expansion card heat dissipater 130 may also be fixed to the body 122 of the heat dissipater resilient structure 120 by other means enabling quick-release. The invention does not intend to impose a limitation on this regard. In addition, even if the expansion card heat dissipater 130 is not removed, the uprising expansion card heat dissipater 130 may provide enough space for replacing the expansion card 20 located below the heat dissipater 130 for the expansion card.

Figure 9:
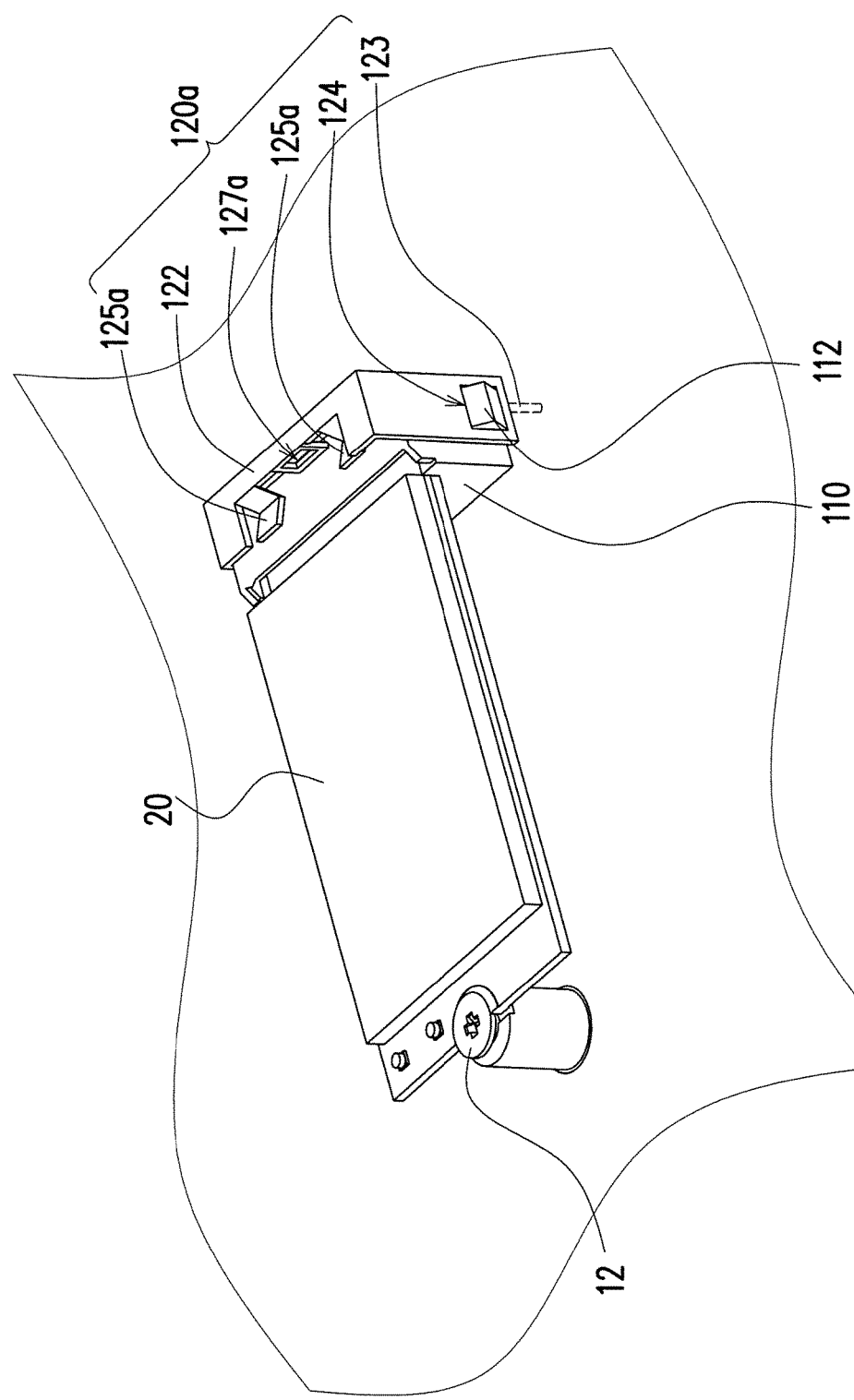
FIG. 9 is a schematic view illustrating a heat dissipater resilient structure according to an embodiment of the invention.

FIG. 9 is a schematic view illustrating the heat dissipater resilient structure according to an embodiment of the invention. In the embodiment of FIG. 9, components same as or similar to those in the preceding descriptions are represented by like or similar symbols. In the following, only the main difference is described. Referring to FIG. 9, a heat dissipater resilient structure 120a of FIG. 9 mainly differs from the heat dissipater resilient structure 120 in that, in the embodiment, a fixing member 127a is a perforated slot on the body 122, and the heat dissipater resilient structure 120a includes two arms 125a disposed for the expansion card heat dissipater 130 (shown in FIG. 3) to pop up. The arms 125a are located at two sides of the fixing member 127a. It should be noted that, in other embodiments, the quantities, shapes, positions, and fixing means of the arm 125a and the fixing member 127a are not limited thereto, as long as the heat dissipater resilient structure 120a fixes the expansion card heat dissipater 130 by the fixing member 127a, and the heat dissipater 130 allows the expansion card to pop up by the arms 125a when not pressed.

In view of the foregoing, the heat dissipater resilient structure according to the embodiments may be fixed to the connector. When the expansion card heat dissipater is to be disposed, the expansion card heat dissipater may be fixed to the fixing member of the heat dissipater resilient structure. Under such circumstance, the expansion card heat dissipater leans against the arm. Then, as long as a force is exerted to the end of the expansion card heat dissipater away from the heat dissipater resilient structure, the expansion card heat dissipater may move with the arm from the first position to the second position to abut against the expansion card. Then, the end of the expansion card heat dissipater away from the heat dissipater resilient structure may be fixed to the motherboard by locking, for example. When the expansion card heat dissipater is to be removed or the expansion card is to be replaced, by canceling fixing between the expansion card heat dissipater and the motherboard, the arm of the heat dissipater resilient structure may drive the expansion card heat dissipater upward to return to the first position. Accordingly, the user may conveniently obtain the expansion card heat dissipater or replace the expansion card located below the expansion card heat dissipater.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat dissipater resilient structure, adapted to be fixed to a connector on a motherboard and for an expansion card heat dissipater to be disposed on, the heat dissipater resilient structure comprising:
   a body, adapted to be fixed to the connector;
   an arm, extending from the body and bendable between a first position and a second position relative to the body;
   a fixing member, located at the body or the arm, wherein the heat dissipater of the expansion card is adapted to be fixed to the fixing member of the heat dissipater resilient structure and leans against the arm to move with the arm, the expansion card heat dissipater is adapted to move with the arm from the first position to the second position when pressed, the arm moves with the expansion card heat dissipater to return to the first position when the expansion card heat dissipater is released from pressing, and the fixing member is a perforated slot located at the arm or the body for the expansion card heat dissipater to pass through.

2. The heat dissipater resilient structure as claimed in claim 1, wherein a portion of the arm away from the body forms an inclined surface, and the inclined surface extends upwardly.

3. The heat dissipater resilient structure as claimed in claim 1, wherein the body comprises a solder leg adapted to be fixed to the motherboard.

4. A connector module, adapted to be fixed to a motherboard and connected with an expansion card, the connector module comprising:
   a connector;
   a heat dissipater resilient structure, comprising:
      a body, fixed to the connector;
      an arm, extending from the body and bendable relative to the body; and
      a fixing member, located at the body or the arm; and
   an expansion card heat dissipater, detachably fixed to the fixing member of the heat dissipater resilient structure and leaning against the arm to move with the arm between a first position and a second position, wherein
   an acute angle is included between the expansion card heat dissipater and the expansion card when the expansion card is inserted into the connector and the expansion card heat dissipater is located at the first position,
   the expansion card heat dissipater abuts against the expansion card when the expansion card heat dissipater is pressed and moves with the arm to the second position, and
   the arm moves with the expansion card heat dissipater to return to the first position when the expansion card heat dissipater is released from pressing.

5. The connector module as claimed in claim 4, wherein a portion of the arm away from the body gradually extends away from the motherboard to form an inclined surface, and the inclined surface extends upwardly.

6. The connector module as claimed in claim 4, wherein the fixing member is a perforated slot located at the arm or the body, and the expansion card heat dissipater comprises a tongue passing through the perforated slot.

7. The connector module as claimed in claim 4, wherein the body comprises a solder leg adapted to be fixed to the motherboard.

8. The connector module as claimed in claim 4, wherein the expansion card heat dissipater comprises a base and a fin set disposed on the base, the base comprises two holding members located at opposite sides, and the two holding members respectively extend from the base in directions away from the fin set and are adapted to hold the expansion card.

9. The connector module as claimed in claim 8, wherein the base further comprises a base fixing member adapted to be fixed to the motherboard.

10. The connector module as claimed in claim 4, wherein the connector comprises a first engagement part, the body of the heat dissipater resilient structure comprises a second engagement part corresponding to the first engagement part, and the body of the heat dissipater resilient structure is fixed to the connector by fitting of the first engagement part and the second engagement part.

* * * * *